United States Patent
Hokayem et al.

(10) Patent No.: US 11,133,851 B1
(45) Date of Patent: Sep. 28, 2021

(54) BEAMFORMING CONFIGURATION VIA CROSS-MIXING

(71) Applicants: Rimon Hokayem, Miami, FL (US); Elias Alwan, Miami, FL (US); John L. Volakis, Miami, FL (US)

(72) Inventors: Rimon Hokayem, Miami, FL (US); Elias Alwan, Miami, FL (US); John L. Volakis, Miami, FL (US)

(73) Assignee: THE FLORIDA INTERNATIONAL UNIVERSITY BOARD OF TRUSTEES, Miami, FL (US)

( * ) Notice: Subject to any disclaimer, the term of this patent is extended or adjusted under 35 U.S.C. 154(b) by 0 days.

(21) Appl. No.: 17/217,520

(22) Filed: Mar. 30, 2021

(51) Int. Cl.
| | |
|---|---|
| H04B 7/06 | (2006.01) |
| H01P 5/16 | (2006.01) |
| H01Q 1/50 | (2006.01) |
| H03F 3/19 | (2006.01) |

(52) U.S. Cl.
CPC ........... *H04B 7/0617* (2013.01); *H01P 5/16* (2013.01); *H01Q 1/50* (2013.01); *H03F 3/19* (2013.01); *H03F 2200/294* (2013.01); *H03F 2200/451* (2013.01)

(58) Field of Classification Search
CPC ... H04B 7/0617; H03F 3/19; H03F 2200/294; H01P 5/16; H01Q 1/50
See application file for complete search history.

(56) References Cited

U.S. PATENT DOCUMENTS 10,680,694 B1   6/2020   Hokayem et al.

OTHER PUBLICATIONS

Rimon Hokayem et al., A Compact Beamforming Concept Based on Element-to-Element Mixing for 5G Applications, IEEE International Workshop on Antenna Technology (iWAT), Jun. 2019, pp. 186-188.
Rimon Hokayem et al., Beamforming Apertures with Wideband Low-Cost Front-Ends, 2019 IEEE International Sumposium on Antennas and Propagation and USNC-URSI Radio Science Meeting, Atalanta, GA, 2019, pp. 1723-1724.

*Primary Examiner* — Robert J Pascal
*Assistant Examiner* — Kimberly E Glenn
(74) *Attorney, Agent, or Firm* — Saliwanchik, Lloyd & Eisenschenk

(57) ABSTRACT

Systems and methods for beamforming based on mixing elements together instead of conventional phase shifting are provided. A beamformer can be used to cross-mix the elements with one another to compensate for delays in signal reception. By replacing phase shifters with mixers, the system becomes agnostic to frequency of operation and angle of arrival.

20 Claims, 7 Drawing Sheets

BEAMFORMING CONFIGURATION VIA CROSS-MIXING

GOVERNMENT SUPPORT

This invention was made with government support under 1731649 awarded by National Science Foundation (NSF). The government has certain rights in the invention.

BACKGROUND

Existing beamformers suffer greatly from the size and cost of the RF front-end and digital back-end components. Notably, such systems use analog phase shifters to compensate for the delay in reception between the antenna elements. This creates receivers that are narrowband and frequency dependent.

Self-mixing beamforming configurations have demonstrated flexibility to frequency of operation and angle of arrival (see, e.g., (1) Kornprobst et al., "A Millimeter-Wave Self-Mixing Array With Large Gain and Wide Angular Receiving Range," in IEEE Transactions on Antennas and Propagation, vol. 66, no. 2, pp. 702-711, February 2018, doi: 10.1109/TAP.2017.2780897; (2) Wang et al., "Self-mixing antenna arrays with wide receiving angular range," 2015 IEEE International Symposium on Antennas and Propagation & USNC/URSI National Radio Science Meeting, Vancouver, BC, Canada, 2015, pp. 647-648, doi: 10.1109/APS.2015.7304710; and (3) U.S. Pat. No. 10,680,694-B1). Notably, self-mixing replaces bulky phase shifters with mixers, and offers wideband apertures.

Among the self-mixing beamformer structures, mixers have been used to mix every array element with itself, making all the elements in phase with each other and canceling out delays in reception; and cross-mixing of every two elements about the array center to combine all the elements coherently together has been implemented with phase-locked loops (PLLs) in the mixing process.

BRIEF SUMMARY

Embodiments of the subject invention provide novel and advantageous systems and methods for beamforming based on mixing elements together instead of conventional phase shifting. A beamformer can be used to cross-mix the elements with one another to compensate for delays in signal reception. By replacing phase shifters with mixers, the system becomes agnostic to frequency of operation and angle of arrival.

In an embodiment, a cross-mixing beamformer (CMB) device may comprise: an antenna array with an array center, a first antenna disposed at a first location with respect to the array center, and a second antenna disposed at a second location opposite from the first location with respect to the array center; a first mixing unit in operable communication with the first antenna and the second antenna, the first mixing unit having: a first input channel configured to receive a first input signal ($y_1$) from the first antenna; a first power splitter configured to divide the first input signal into at least two branches, including a first radio frequency (RF) branch connected to a first RF-bandpass filter configured to isolate a first RF signal ($RF_1$), and a first local oscillator (LO) branch connected to a first LO-bandpass filter configured to isolate a first LO signal ($LO_1$); a second input channel configured to receive a second input signal ($y_2$) from the second antenna; a second power splitter configured to divide the second input signal into at least two branches, including a second RF branch connected to a second RF-bandpass filter configured to isolate a second RF signal ($RF_2$), and a second LO branch connected to a second LO-bandpass filter configured to isolate a second LO signal ($LO_2$); a first frequency mixer comprising a first RF-input port configured to receive $RF_1$, a first LO-input port configured to receive $LO_2$, and a first combined-output port configured to produce a first product signal ($y_{P1}$); a second frequency mixer comprising a second RF-input port configured to receive $RF_2$, a second LO-input port configured to receive $LO_1$, and a second combined-output port configured to produce a second product signal ($y_{P2}$); a first product-bandpass filter configured to isolate $y_{P1}$; a second product-bandpass filter configured to isolate $y_{P2}$; and a first power combiner configured to combine the isolated $y_{P1}$ with the isolated $y_{P2}$ to produce a first combined signal ($y_{C1}$). The antenna array may be a uniform N-antenna element linear array, where N is an even integer number.

Embodiments may also provide: a third antenna disposed at a third location with respect to the array center, and a fourth antenna disposed at a fourth location opposite from the third location with respect to the array center; a second mixing unit in operable communication with the third antenna and the fourth antenna, the second mixing unit comprising a second power combiner configured to produce a second combined signal ($y_{C2}$); and a final summing power combiner configured to combine at least $y_{C1}$ with $y_{C2}$ to produce a final combined output signal ($y_{CF}$); a third input channel configured to receive a third input signal from the third antenna; a third power splitter configured to divide the third input signal into at least two branches, including a third RF branch connected to a third RF-bandpass filter configured to isolate a third RF signal ($RF_3$), and a third local oscillator (LO) branch connected to a third LO-bandpass filter configured to isolate a third LO signal ($LO_3$); a fourth input channel configured to receive a fourth input signal from the fourth antenna; a fourth power splitter configured to divide the fourth input signal into at least two branches, including a fourth RF branch connected to a fourth RF-bandpass filter configured to isolate a fourth RF signal ($RF_4$), and a fourth LO branch connected to a fourth LO-bandpass filter configured to isolate a fourth LO signal ($LO_4$); a third frequency mixer comprising a third RF-input port configured to receive $RF_3$, a third LO-input port configured to receive $LO_4$, and a third combined-output port configured to produce a third product signal ($y_{P3}$); a fourth frequency mixer comprising a fourth RF-input port configured to receive $RF_4$, a fourth LO-input port configured to receive $LO_3$, and a fourth combined-output port configured to produce a fourth product signal ($y_{P4}$); a third product-bandpass filter configured to isolate $y_{P3}$; and a fourth product-bandpass filter configured to isolate $y_{P4}$; the second power combiner configured to combine the isolated $y_{P3}$ with the isolated $y_{P4}$ to produce the second combined signal ($y_{C2}$).

Embodiments may also provide: a first input low noise amplifier configured to amplify $y_1$ between the first antenna and the first power splitter; and a second input low noise amplifier configured to amplify $y_2$ between the second antenna and the second power splitter, and the second mixing unit further having: a third input low noise amplifier configured to amplify $y_3$ between the third antenna and the third power splitter; and a fourth input low noise amplifier configured to amplify $y_4$ between the fourth antenna and the fourth power splitter. Embodiments may also provide the first input low noise amplifier, the second input low noise amplifier, the third input low noise amplifier, and the fourth input low noise amplifier each having a gain value of, for example, in a range of from 10 decibels (dB) to 40 dB, though embodiments are not limited thereto.

Embodiments may also provide: a first LO low noise amplifier configured to amplify $LO_1$ between the first LO-bandpass filter and the second frequency mixer; and a second LO low noise amplifier configured to amplify $LO_2$ between the second LO-bandpass filter and the first frequency mixer, and the second mixing unit further having: a third LO low noise amplifier configured to amplify $LO_3$ between the third LO-bandpass filter and the fourth frequency mixer; and a fourth LO low noise amplifier configured to amplify $LO_4$ between the fourth LO-bandpass filter and the third frequency mixer.

Embodiments may also provide: each of the first LO-bandpass filter, the second LO-bandpass filter, the third LO-bandpass filter, and the fourth LO-bandpass filter having a common upper LO-cutoff frequency, a common lower LO-cutoff frequency, and a common desired-LO frequency $(f_{LO})$ therebetween, each of the first RF-bandpass filter, the second RF-bandpass filter, the third RF-bandpass filter, and the fourth RF-bandpass filter having a common upper RF-cutoff frequency, a common lower RF-cutoff frequency, and a common desired-RF frequency $(f_{RF})$ therebetween, $f_{LO}$ being bounded by an equation of the form, $$f_{RF} - \frac{5c}{36(N-1)d} \le f_{LO} \le f_{RF} + \frac{5c}{36(N-1)d}$$

for even-integer values of N corresponding to a uniform N-antenna element linear array where N is an even integer number, N being a number greater than or equal to 2, c is the speed of light (2.99792458×108 meters per second (m/s)), and d is the distance between the adjacent antennas of the array, with $d<\lambda_{RF}/2$ where $\lambda_{RF}$ is the wavelength of the RF frequency.

In an embodiment, a CMB method for providing improved beamformed reception signal from an antenna array having an array center and antenna elements $A_{(1)}$ through $A_{(N)}$, where N is an even integer number can comprise the steps of: selecting one or more unique integer values j, such that $(1 \le j \le N/2)$; for each selected value of j: selecting an antenna element pair $(A_{(j)}$ and $A_{(N-j)})$ where each antenna element of the antenna element pair is located opposite from the other with respect to the array center; receiving a first signal $y_{(j)}$ from $A_{(j)}$; splitting $y_{(j)}$ and filtering $y_{(j)}$ to produce a first radio frequency signal $RF_{(j)}$ and a first local oscillator signal $LO_{(j)}$; receiving a second signal $y_{(N-j)}$ from $A_{(N-j)}$; splitting $y_{(N)}$ and filtering $y_{(N-j)}$ to produce a second radio frequency signal $RF_{(N-j)}$ and a second local oscillator signal $LO_{(N-j)}$; amplifying $LO_{(j)}$; amplifying $LO_{(N-j)}$; mixing $RF_{(j)}$ and $LO_{(N-j)}$ to produce a first product signal $yp_{(j)}$; mixing $RF_{(N-j)}$ and $LO_{(j)}$ to produce a second product signal $yp_{(N-j)}$; filtering to isolate $yp_{(j)}$; filtering to isolate $yp_{(N-j)}$; combining $yp_{(j)}$ and $yp_{(N-j)}$ to produce a combined signal $yc_{(j)}$; and summing the combined signal $yc_{(j)}$ for each selected value of j to produce an improved beamformed reception signal, $y_{BF}$, the antenna array being a uniform N-antenna element antenna array, the uniform N-antenna element antenna array being a linear antenna array.

In certain embodiments the step of selecting one or more unique integer values j, such that $(1 \le j \le N/2)$, further includes selecting all available unique integer values j, such that $(1 \le j \le N/2)$.

In certain embodiments the step of receiving a first signal $y_{(j)}$ from $A_{(j)}$ further includes amplifying $y_{(j)}$ with a low noise amplifier.

In certain embodiments the step of splitting $y_{(j)}$ and filtering $y_{(j)}$ to produce $RF_{(j)}$ and $LO_{(j)}$ further comprising filtering to an RF frequency between $RF_{min}$ and $RF_{max}$ and filtering to an LO frequency between $LO_{min}$ and $LO_{max}$.

In certain embodiments the step of amplifying $LO_{(j)}$ further includes amplifying $LO_{(j)}$ with a low noise amplifier, and the step of amplifying $LO_{(N-j)}$ further includes amplifying $LO_{(N-j)}$ with the low noise amplifier.

In certain embodiments the step of filtering to isolate $yp_{(j)}$ further includes filtering to a first output frequency between output/$IF_{min}$ and output/$IF_{max}$, and the step of filtering to isolate $yp_{(N-j)}$ further includes filtering to a second output frequency between output/$IF_{min}$ and output/$IF_{max}$, where the desired IF frequency $(f_{IF})$ therebetween is the summation of the RF and LO frequencies.

In an embodiment, a CMB device can comprise: an antenna array having an array center, a first antenna disposed at a first location with respect to the array center, a second antenna disposed at a second location opposite from the first location with respect to the array center, a third antenna disposed at a third location with respect to the array center, and a fourth antenna disposed at a fourth location opposite from the third location with respect to the array center, the antenna array being a uniform N-antenna element linear array, where N is an even integer number; a first mixing unit in operable communication with the first antenna and the second antenna, the first mixing unit having: a first input channel configured to receive a first input signal $(y_1)$ from the first antenna; a first power splitter configured to divide the first input signal into at least two branches, including a first radio frequency (RF) branch connected to a first RF-bandpass filter configured to isolate a first RF signal $(RF_1)$, and a first local oscillator (LO) branch connected to a first LO-bandpass filter configured to isolate a first LO signal $(LO_1)$; a second input channel configured to receive a second input signal $(y_2)$ from the second antenna; a second power splitter configured to divide the second input signal into at least two branches, including frequency second RF branch connected to a second RF-bandpass filter configured to isolate a second RF signal $(RF_2)$, and a second LO branch connected to a second LO-bandpass filter configured to isolate a second LO signal $(LO_2)$; a first frequency mixer comprising a first RF-input port configured to receive $RF_1$, a first LO-input port configured to receive $LO_2$, and a first combined-output port configured to produce a first product signal $(y_{P1})$; a second frequency mixer comprising a second RF-input port configured to receive $RF_2$, a second LO-input port configured to receive $LO_1$, and a second combined-output port configured to produce a second product signal $(y_{P2})$; a first product-bandpass filter configured to isolate $y_{P1}$; a second product-bandpass filter configured to isolate $y_{P2}$; and a first power combiner configured to combine the isolated $y_{P1}$ with the isolated $y_{P2}$ to produce a first combined signal $(y_{C1})$; a second mixing unit in operable communication with the third antenna and the fourth antenna, the second mixing unit comprising a second power combiner configured to produce a second combined signal $(y_{C2})$; the CMB device further comprising a final summing power combiner configured to combine at least $y_{C1}$ with $y_{C2}$ to produce a final combined output signal $(y_{CF})$.

Some embodiments provide the second mixing unit further having: a third input channel configured to receive a third input signal from the third antenna; a third power splitter configured to divide the third input signal into at least two branches, including a third RF branch connected to a third RF-bandpass filter configured to isolate a third RF signal ($RF_3$), and a third local oscillator (LO) branch connected to a third LO-bandpass filter configured to isolate a third LO signal ($LO_3$); a fourth input channel configured to receive a fourth input signal from the fourth antenna; a fourth power splitter configured to divide the fourth input signal into at least two branches, including a fourth RF branch connected to a fourth RF-bandpass filter configured to isolate a fourth RF signal ($RF_4$), and a fourth local oscillator (LO) branch connected to a fourth LO-bandpass filter configured to isolate a fourth LO signal ($LO_4$); a third frequency mixer comprising a third RF-input port configured to receive $RF_3$, a third LO-input port configured to receive $LO_4$, and a third combined-output port configured to produce a third product signal ($y_{P3}$); a fourth frequency mixer comprising a fourth RF-input port configured to receive $RF_4$, a fourth LO-input port configured to receive $LO_3$, and a fourth combined-output port configured to produce a fourth product signal ($y_{P4}$); a third product-bandpass filter configured to isolate $y_{P3}$; and a fourth product-bandpass filter configured to isolate $y_{P4}$, the second power combiner configured to combine the isolated $y_{P3}$ with the isolated $y_{P4}$ to produce the second combined signal ($y_{C2}$)

Some embodiments provide the first mixing unit further having: a first input low noise amplifier configured to amplify $y_1$ between the first antenna and the first power splitter; a second input low noise amplifier configured to amplify $y_2$ between the second antenna and the second power splitter; a first LO low noise amplifier configured to amplify $LO_1$ between the first LO-bandpass filter and the second frequency mixer; and a second LO low noise amplifier configured to amplify $LO_2$ between the second LO-bandpass filter and the first frequency mixer, the second mixing unit further comprising: a third input low noise amplifier configured to amplify $y_3$ between the third antenna and the third power splitter; and a fourth input low noise amplifier configured to amplify $y_4$ between the fourth antenna and the fourth power splitter; a third LO low noise amplifier configured to amplify $LO_3$ between the third LO-bandpass filter and the fourth frequency mixer; and a fourth LO low noise amplifier configured to amplify $LO_4$ between the fourth LO-bandpass filter and the third frequency mixer.

Some embodiments provide each of the first input low noise amplifier, the second input low noise amplifier, the third input low noise amplifier, and the fourth input low noise amplifier having a gain value (e.g., in a range of 10 dB to 40 dB, though embodiments are not limited thereto), each of the first LO-bandpass filter, the second LO-bandpass filter, the third LO-bandpass filter, and the fourth LO-bandpass filter having a common upper LO-cutoff frequency, a common lower LO-cutoff frequency, and a common desired-LO frequency ($f_{LO}$) therebetween, each of the first RF-bandpass filter, the second RF-bandpass filter, the third RF-bandpass filter, and the fourth RF-bandpass filter having a common upper RF-cutoff frequency, a common lower RF-cutoff frequency, and a common desired-RF frequency ($f_{RF}$) therebetween, $f_{LO}$ being bounded by an equation of the form, $$f_{RF} - \frac{5c}{36(N-1)d} \le f_{LO} \le f_{RF} + \frac{5c}{36(N-1)d}$$

for even-integer values of N corresponding to the N-antenna element linear array, N being a number greater than or equal to 2, c is the speed of light, and d is the distance between the adjacent antennas of the array, with $d<\lambda_{RF}/2$ where $\lambda_{RF}$ is the wavelength of the RF frequency.

DETAILED DESCRIPTION

Figure 1:
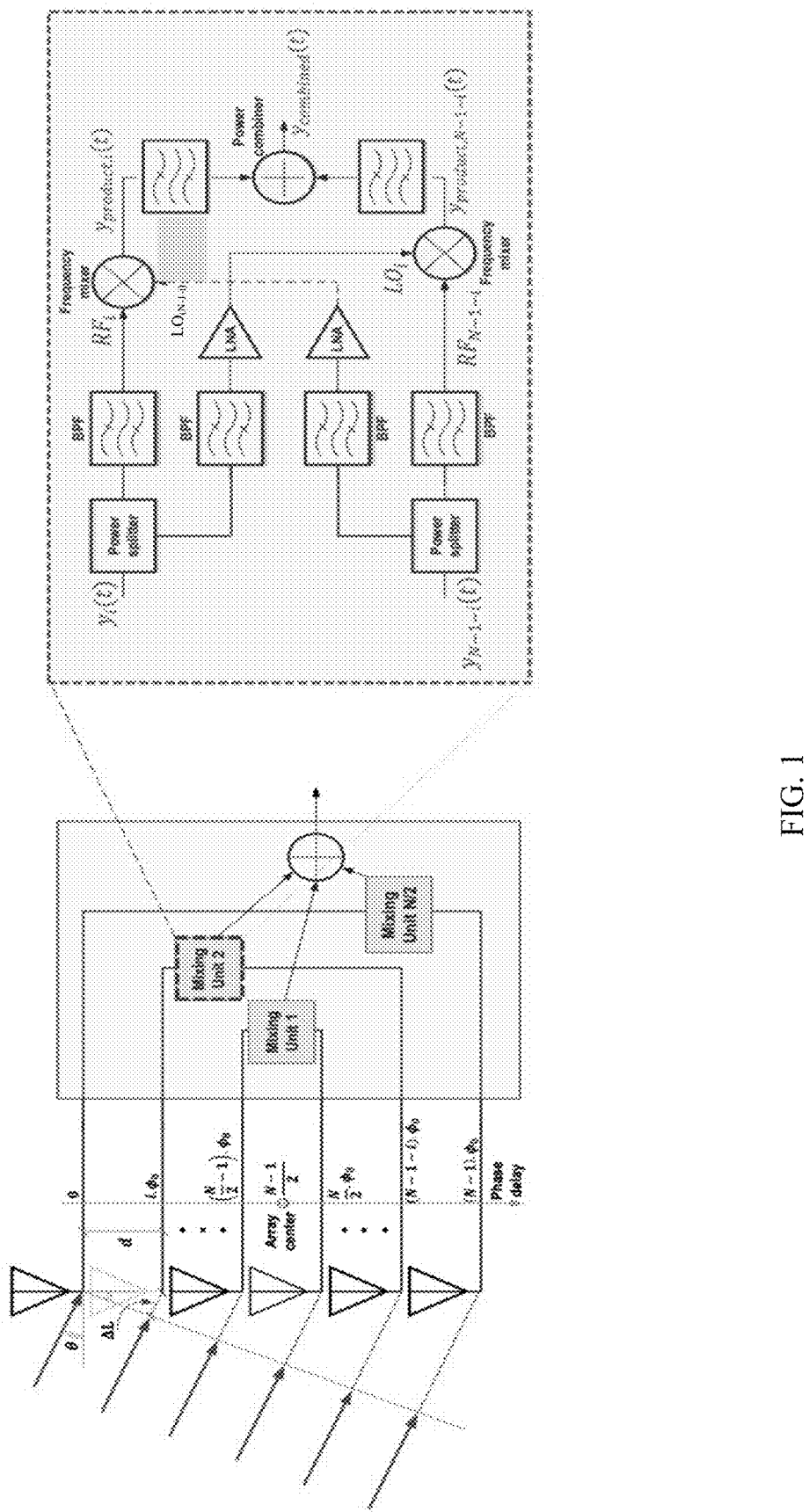
FIG. 1 is a schematic representation of an embodiment of the subject invention.

Embodiments of the subject invention provide novel and advantageous systems and methods for beamforming based on mixing elements together instead of conventional phase shifting. A beamformer can be used to cross-mix the elements with one another to compensate for delays in signal reception. By replacing phase shifters with mixers, the system becomes agnostic to frequency of operation and angle of arrival.

In certain embodiments, mixers are implemented instead of phase shifters to compensate for the phase delay between the elements, and phase-locked loops (PLLs) are removed from the design thus enhancing system stability with reductions in size, cost, and power. The frequency-independency of embodiments of the subject invention enables multi-function operation and wideband application, while reducing significantly the number of components needed; thereby reducing power, cost, and size of the system.

Embodiments may process the signal received at any direction of arrival, significantly enhancing the angle resolution, making the design more flexible, and no more dependent of frequency of operation: removing phase shifters and bias control circuitry needed to accommodate for every direction of arrival, and reducing power consumption.

Embodiments may be integrated into subarray formations (hybrid beamforming), hence reducing the number of analog-to-digital converters serving the elements.

Embodiments are compatible with off-the-shelf components and manufactured with PCB technology for inexpensive and low-cost mass production. The small form factor and compatibility with current and envisioned future technology are beneficial for commercial, military, and scientific sectors.

Embodiments may replace several narrowband systems for orders of magnitude reduction in power, cost, and size.

To illustrate a non-limiting embodiment, a uniform linear antenna array can be considered, and the array center as can be defined as the spatial reference that sits in the middle of the array. Every two oppositely spaced elements in reference to the array center may be mixed. The cross-mixing module may be defined as follows. First, the received signal from a first array element is split using a first 2-way power splitter. Each output port of the first 2-way power splitter connects to a bandpass filter. In a first branch of the first splitter output, the desired radio frequency (RF) signal is filtered out and inputted into the RF port of a balanced mixer. In a second branch of the first splitter output the LO signal is filtered out and subsequently amplified via a low-noise power amplifier before being fed to the LO mixer port of a second (opposite) antenna element chain to drive the mixer of the opposite element. Similarly, the opposite (second) element chain splits its received signal and provides the LO signal needed for the corresponding opposite (first) mixing process. Hence, every two opposite elements about the array center mix with one another and for an array of N antenna elements, this cross-mixing architecture yields N mixing processes. Next, the mixed up-converted signals are filtered out using a bandpass filter. Finally, the N resulting signals are combined together using a power combiner.

Embodiments may cross-mix every two elements around the array center without the intervention of PLLs, saving cost and complexity by removing the PLLs from the architecture. PLLs have been used to synthesize the local oscillator (LO) signal needed to mix the received radio frequency (RF) signal. In certain embodiments of the subject invention, the LO signal is advantageously sent over the air along with RF information.

An embodiment employing this cross-mixing design is shown in FIG. 1. The received signal, $y_i(t)$, is first split using a power divider. Bandpass filters are then used to filter out the desired LO and RF signals. The LO signal is subsequently amplified, $LO_i$, and fed to the opposite element chain to mix its corresponding filtered RF signal, $RF_{N-1-i}$, via a balanced mixer.

The RF signal from the $i^{th}$ antenna element, $RF_i$, for $(0 \leq i \leq (N-1))$ is mixed with the opposite LO signal from the $(N-1-i)^{th}$ element, $LO_{N-1-i}$, to generate the mixed signal, $y_{product,i}(t)$, for the $i^{th}$ front-end chain. Similarly, the RF signal from the $(N-1-i)^{th}$ element, $RF_{N-1-i}$, is mixed with the LO signal from the $i^{th}$ antenna element, $LO_i$, to generate the mixed signal, $y_{product,N-1-i}$, for the $(N-1-i)^{th}$ chain.

Every two oppositely spaced elements in reference to the array's center are mixed and the mixed up-converted signals are filtered out and then combined together with a power combiner. For an array of N antenna elements, this cross-mixing architecture yields N mixing processes. This process is repeated for every two elements, oppositely spaced from the array center to achieve coherent signal combining and power gain.

A more detailed explanation of this non-limiting exemplary embodiment considers a uniform N-antenna element linear array, where N is an even integer number.

As depicted in FIG. 1, the received signal at the $i^{th}$ antenna can be expressed as, $$y_i(t) = \cos(2\pi f_{RF} t + i \cdot \Delta\phi_{RF}) + \cos(2\pi f_{LO} t + i \cdot \Delta\phi_{LO}) \quad (1)$$

where $f_{RF}$ and $f_{LO}$ are the RF and LO frequencies, $\Delta\phi_{RF}$ and $\Delta\phi_{LO}$ are the corresponding RF and LO phase delays, respectively.

The RF and LO signals encounter a progressive phase delay of $\Delta\phi_{RF}$ and $\Delta\phi_{LO}$ from one antenna element to the next, respectively.

As depicted in FIG. 1, the filtered signal resulting from mixing $RF_i$ with $LO_{N-1-i}$ at the $i^{th}$ element chain is expressed as, $$y_{product,i}(t) = \cos(2\pi f_{RF} t + i \cdot \Delta\phi_{RF}) \times \cos(2\pi f_{LO} t + (N-1-i) \cdot \Delta\phi_{LO}) = \cos(2\pi f_{RF+LO} t + (N-1)\Delta\phi_{LO} + i(\Delta\phi_{RF} - \Delta\phi_{LO})) \quad (2)$$

Similarly, the mixed signal at the opposite element chain yields, $$y_{product,N-1-i}(t) = \cos(2\pi f_{RF} t + (N-1-i) \cdot \Delta\phi_{RF}) \times \cos(2\pi f_{LO} t + i \Delta\phi_{LO}) = \cos(2\pi f_{RF+LO} t + (N-1)\Delta\phi_{RF} i (\Delta\phi_{LO} - \Delta\phi_{RF})) \quad (3)$$

By combining the two signals (6) and (7), the resulting signal becomes $$y_{combined}(t) = 2 \cdot \cos\left(\frac{(N-1-2i)}{2} \times (\Delta\phi_{RF} - \Delta\phi_{LO})\right) \cdot \cos\left(2\pi f_{RF+LO} t + \frac{(N-1)}{2} \times (\Delta\phi_{RF} + \Delta\phi_{LO})\right) \quad (4)$$

Consequently, the combined signal of all N mixed signals can be expressed as, $$y_{combined,N}(t) = 2 \cdot \sum_{i=0}^{\frac{N}{2}-1} \cos\left(\frac{(N-1-2i)}{2} \times (\Delta\phi_{RF} - \Delta\phi_{LO})\right) \cdot \cos\left(2\pi f_{RF+LO} t + \frac{(N-1)}{2} \times (\Delta\phi_{RF} + \Delta\phi_{LO})\right) \quad (5)$$

To achieve coherent combining for a given number of elements N, the goal is to converge $\Delta\phi_{LO} \rightarrow \Delta\phi_{RF}$.

It was found that by setting the combining gain factor $$\cos\left(\frac{(N-1-2i)}{2} \times (\Delta\phi_{RF} - \Delta\phi_{LO})\right) \geq 0.9 \quad (6)$$

a near-maximum combining gain can be achieved. This is equivalent to 90% of the theoretical maximum combining gain of the traditional beamformers.

As such, using (6), the LO frequency is bounded by, $$f_{RF} - \frac{5c}{36(N-1)d} \leq f_{LO} \leq f_{RF} + \frac{5c}{36(N-1)d} \quad (7)$$

where c is the speed of light, and d is the distance between the adjacent antennas of the array, with $d \leq \lambda_{RF}/2$ and $\lambda_{RF}$ is the wavelength of the RF frequency.

Turning now to the figures, FIG. 1 is a schematic representation of an embodiment of the subject invention showing an antenna array connected to a cross-mixing beamformer (CMB) device. The number of antennas explicitly shown in this uniform linear array is N=6. The antennas are numbered from i=0 to (N-1) and separated by a distance, d. Ellipses indicate additional antennas may be represented for larger values of N.

An array center is shown at (N-1)/2. Opposing pairs of antenna elements are shown opposite each other with respect to the array center. Mixing Units numbering N/2 combine signals from opposing antenna pairs before all Mixing Units feed into to a final Power Combiner. An incoming signal angle, Θ, results in change in travel distance, (ΔL), and a phase lag (i$\varphi_0$), which grows incrementally larger for each subsequent antenna from 0 to N-1.

Mixing Unit 2 is expanded to show details. Two inputs, $y_i(t)$ and $y_{N-1-i}(t)$ enter Mixing Unit 2. The signal from $y_i(t)$ is amplified through a low noise amplifier (LNA) before passing to a power splitter sending one branch through a bandpass filter (BPF) to produce radio frequency signal $RF_i$ and a second branch through another bandpass filter (BPF)

and a low noise amplifier (LNA) to produce local oscillator signal $LO_i$. The signal from $y_{N-1-i}(t)$ is amplified through a low noise amplifier (LNA) before passing to a power splitter sending one branch through a bandpass filter (BPF) to produce radio frequency signal $RF_{N-1-i}$ and a second branch through another bandpass filter (BPF) and a low noise amplifier (LNA) to produce local oscillator signal $LO_{N-1-i}$.

Two Frequency mixers are shown in Mixing Unit 2. The first frequency mixer takes in $RF_i$ and $LO_{N-1-i}$ to produce $y_{product,i}(t)$. The second frequency mixer takes in $RF_{N-1-i}$ and $LO_i$ to produce $y_{product,N-1-i}(t)$. Each of $y_{product,i}(t)$ and $y_{product,N-1-i}(t)$ are filtered through a respective bandpass filter before entering a Power combiner to produce the output from Mixing Unit 2.

Figure 2:
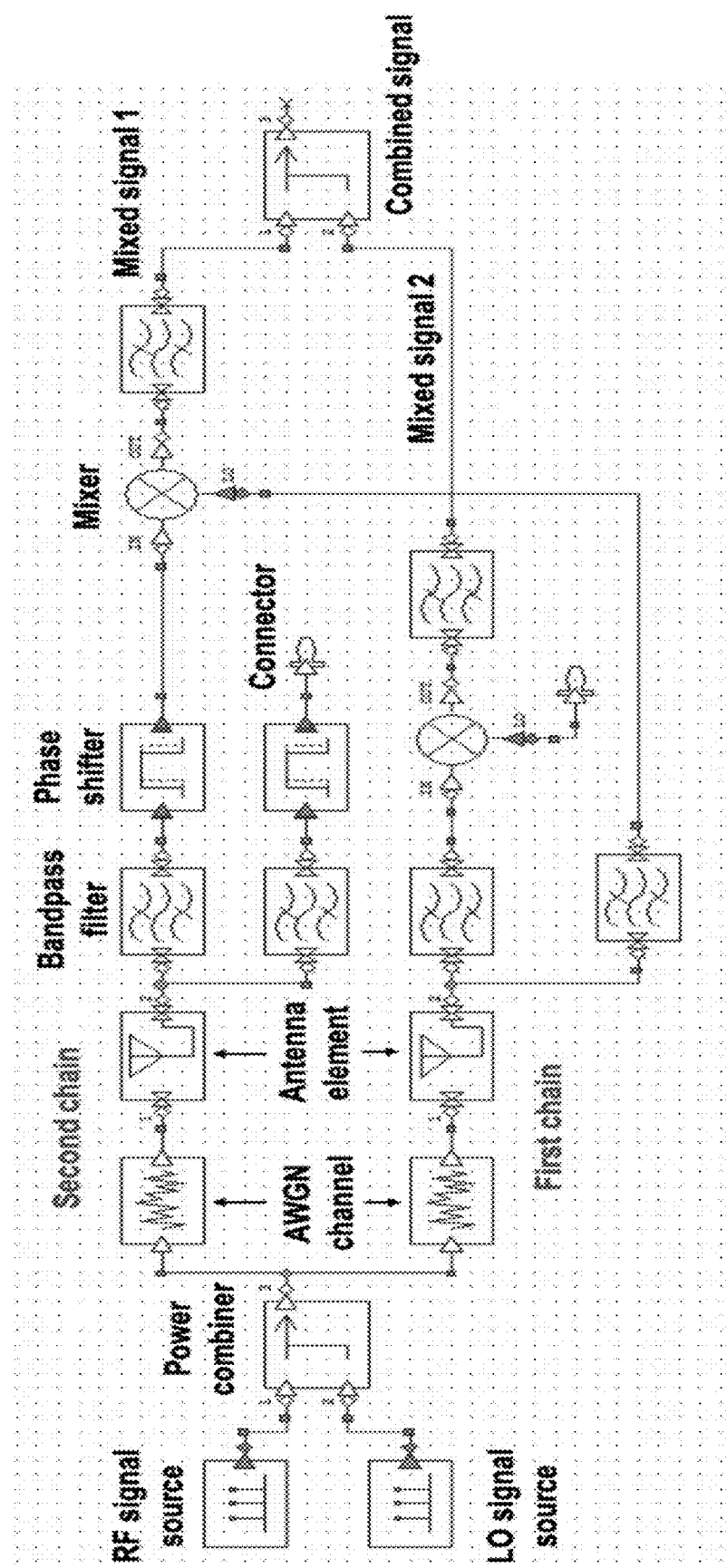
FIG. 2 is a schematic representation of a simulation of an embodiment of the subject invention.

FIG. 2 is a schematic representation of a simulation of an embodiment of the subject invention. An RF signal source and an LO signal source each feed into a power combiner whose output is then split to feed two parallel chains. Each chain has its own additive white Gaussian noise (AWGN) block feeding into an antenna element block before splitting again to a pair of bandpass filters in each chain. The first chain feeds its RF output from one bandpass filter directly into the first chain mixer input. The first chain also feeds its LO output from a second bandpass filter directly to the LO input of the second chain's mixer. The second chain feeds its RF output from one bandpass filter through a phase shifter and also feeds its LO output from a second bandpass filter through a phase shifter to simulate the phase lag due to incoming angle of the signal to the antenna. The phase shifted RF signal is then fed into the second chain's mixer (where it combines with the first chain's LO output) and the second chain's LO output is shown going into a connector which then routes to the LO input of the first chain's mixer. The second chain's mixer produces mixed signal 1 (from second chain RF signal and first chain LO signal) and the first chain's mixer produces mixed signal 2 (from the first chain RF signal and the second chain LO signal). Mixed signal 1 is combined with mixed signal 2 to produce the Combined signal output of the simulation.

Figure 3:
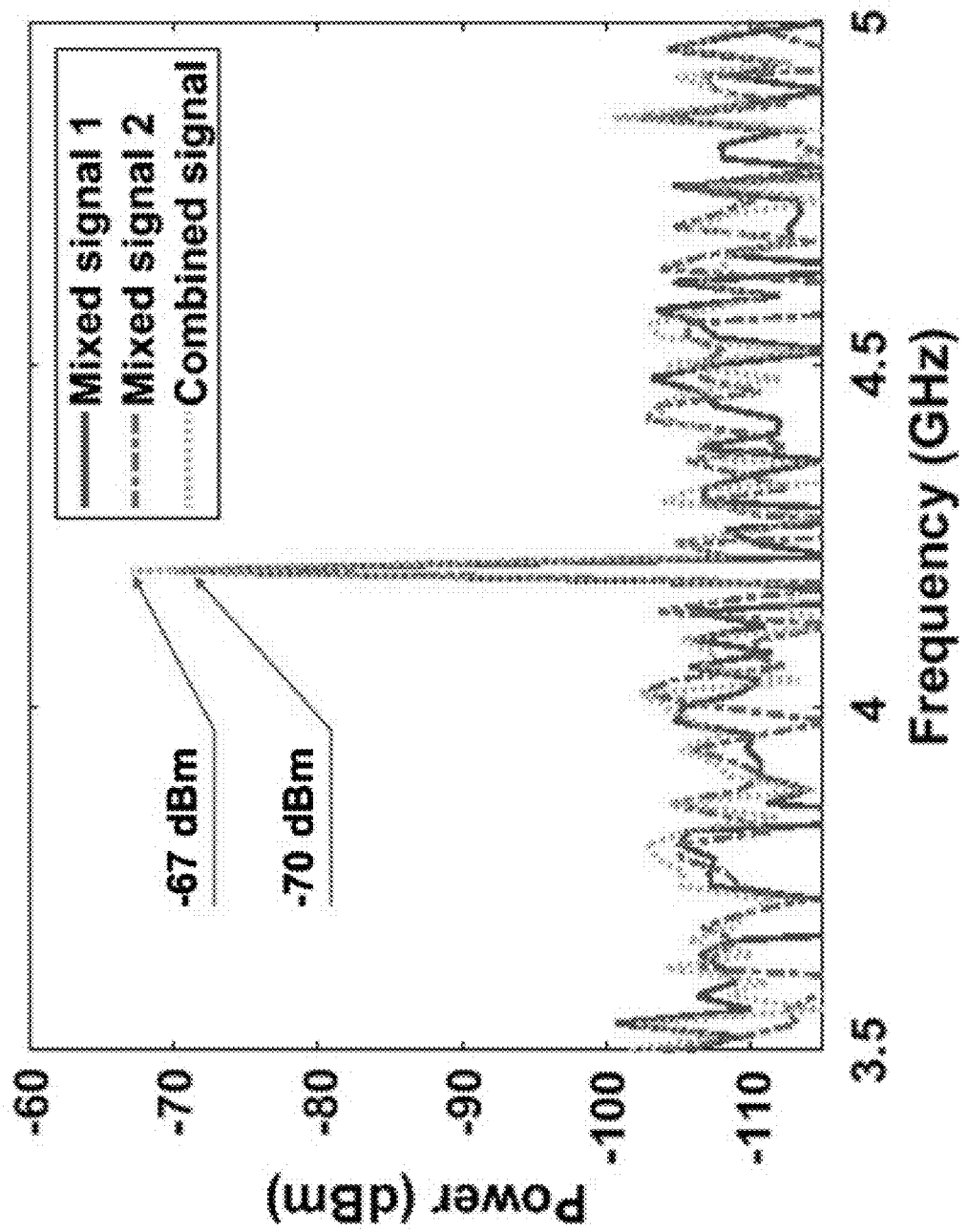
FIG. 3 is a chart showing Power (dBm) vs Frequency (GHz) for an embodiment of the subject invention.

FIG. 3 is a chart showing Power (dBm) vs Frequency (GHz) for an embodiment of the subject invention. Three data series are shown with Mixed signal 1 marked with a solid blue line, Mixed signal 2 a dashed red line, and Combined signal a dotted yellow line. Arrows indicate the peak of Combined signal at −67 dBm and the peak of Mixed signal 1 and Mixed signal 2 at −70 dBm. All three peaks occur together at about 4.2 GHz.

Figure 4:
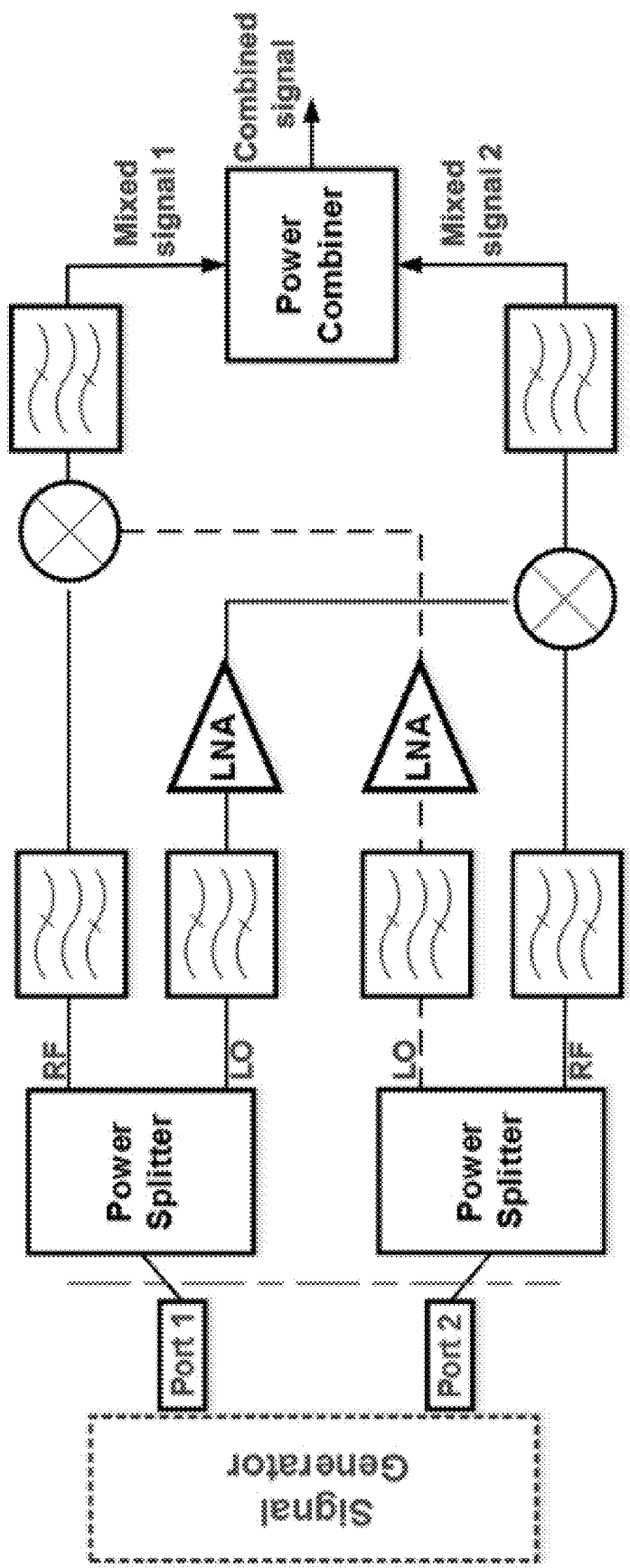
FIG. 4 is a schematic representation of an embodiment of the subject invention.

FIG. 4 is a schematic representation of an embodiment of the subject invention. A signal generator is shown with two ports, Port 1 and Port 2, each feeding a respective power splitter. From each power splitter come two outputs, one RF and one LO. In each case the RF signal is fed directly into a mixer in line with the respective port and power splitter output. In each case the LO signal is fed through a low noise amplifier (LNA) before crossing over to feed into the mixer of the opposite respective port and power splitter output. The RF signal originating from Port 1 is thus mixed with the LO signal originating from Port 2, and the RF signal originating from Port 2 is thus mixed with the LO signal originating from Port 1. After mixing, each mixed signal is fed through a bandpass filter to produce Mixed signal 1 (from the Port 1 RF signal and the Port 2 amplified LO signal), and Mixed signal 2 (from the Port 2 RF signal and the Port 1 amplified LO signal) feeding into a power combiner to produce a combined signal output.

Figure 5:
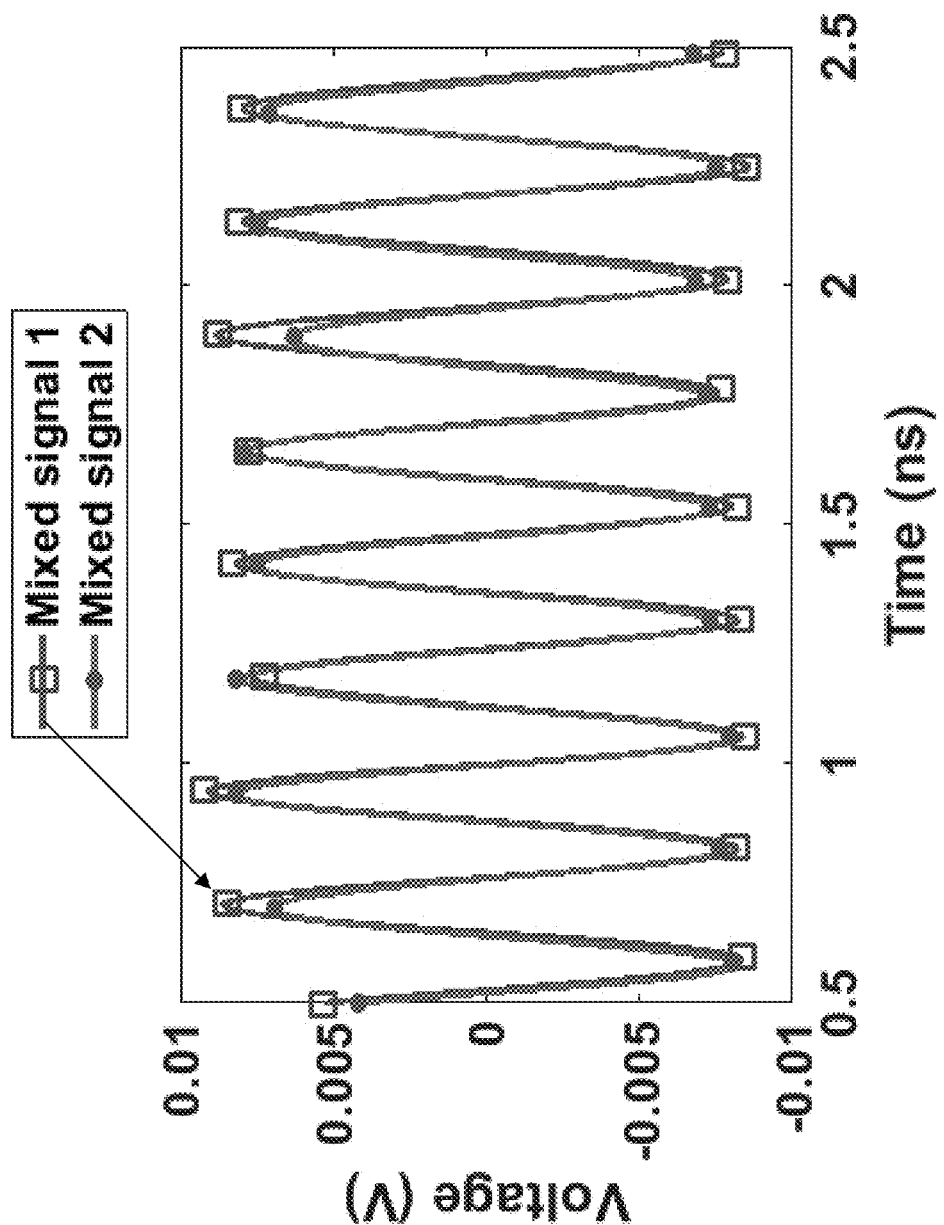
FIG. 5 is a chart showing Voltage (V) vs Time (ns) for an embodiment of the subject invention.
Figure 6:
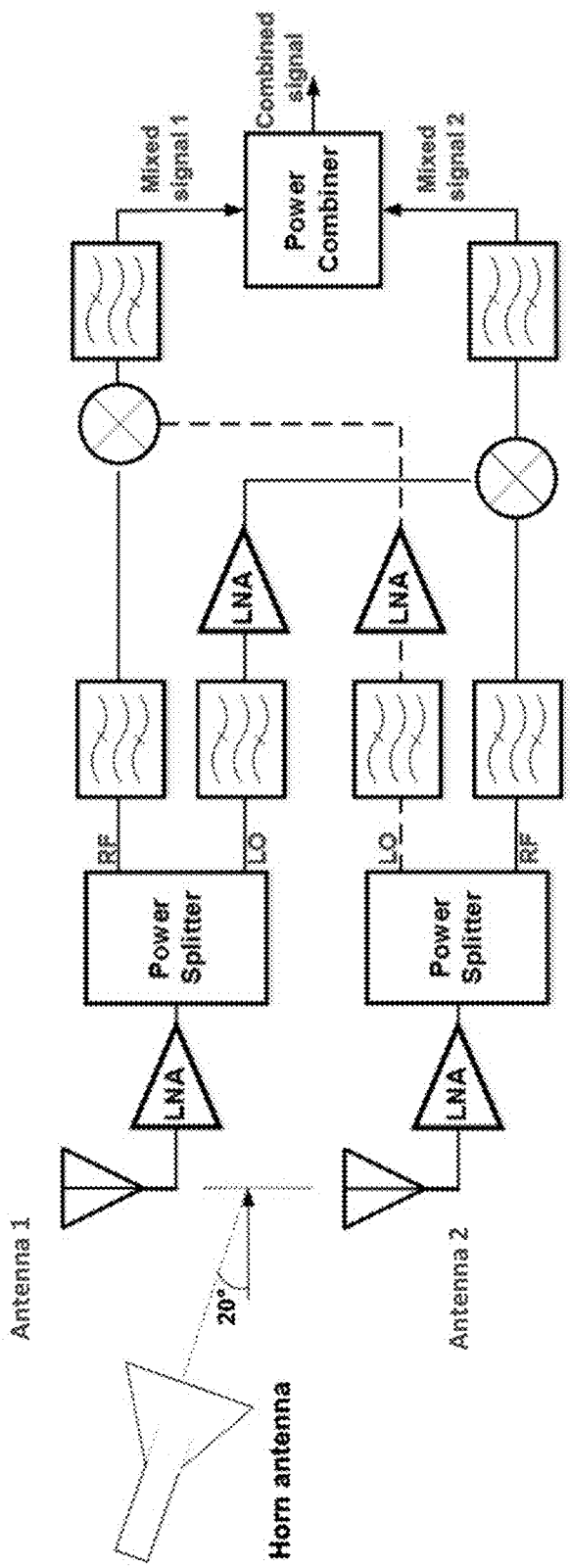
FIG. 6 is a schematic representation of an embodiment of the subject invention.

FIG. 5 is a chart showing Voltage (V) vs Time (ns) for an embodiment of the subject invention. Two data series are labeled Mixed signal 1 (solid blue line with hollow squares), and Mixed signal 2 (solid red line with filled circles), respectively. The two data series produce traces nearly on top of each other, with the respective peaks and valleys of Mixed signal 1 slightly more extreme than the respective peaks and valleys of Mixed signal 2 at most points. FIG. 6 is a schematic representation of an embodiment of the subject invention. A horn antenna is shown broadcasting at an angle of 20-degrees to two receiver antennas, each feeding a respective power splitter. From each power splitter come two outputs, one RF and one LO. In each case the RF signal is fed directly into a mixer in line with the respective antenna and power splitter output. In each case the LO signal is fed through a low noise amplifier (LNA) before crossing over to feed into the mixer of the opposite respective antenna and power splitter output. The RF signal originating from antenna 1 is thus mixed with the LO signal originating from antenna 2, and the RF signal originating from antenna 2 is thus mixed with the LO signal originating from antenna 1. After mixing, each mixed signal is fed through a bandpass filter to produce Mixed signal 1 (from the antenna 1 RF signal and the antenna 2 amplified LO signal), and Mixed signal 2 (from the antenna 2 RF signal and the antenna 1 amplified LO signal) feeding into a power combiner to produce a combined signal output.

Figure 7:
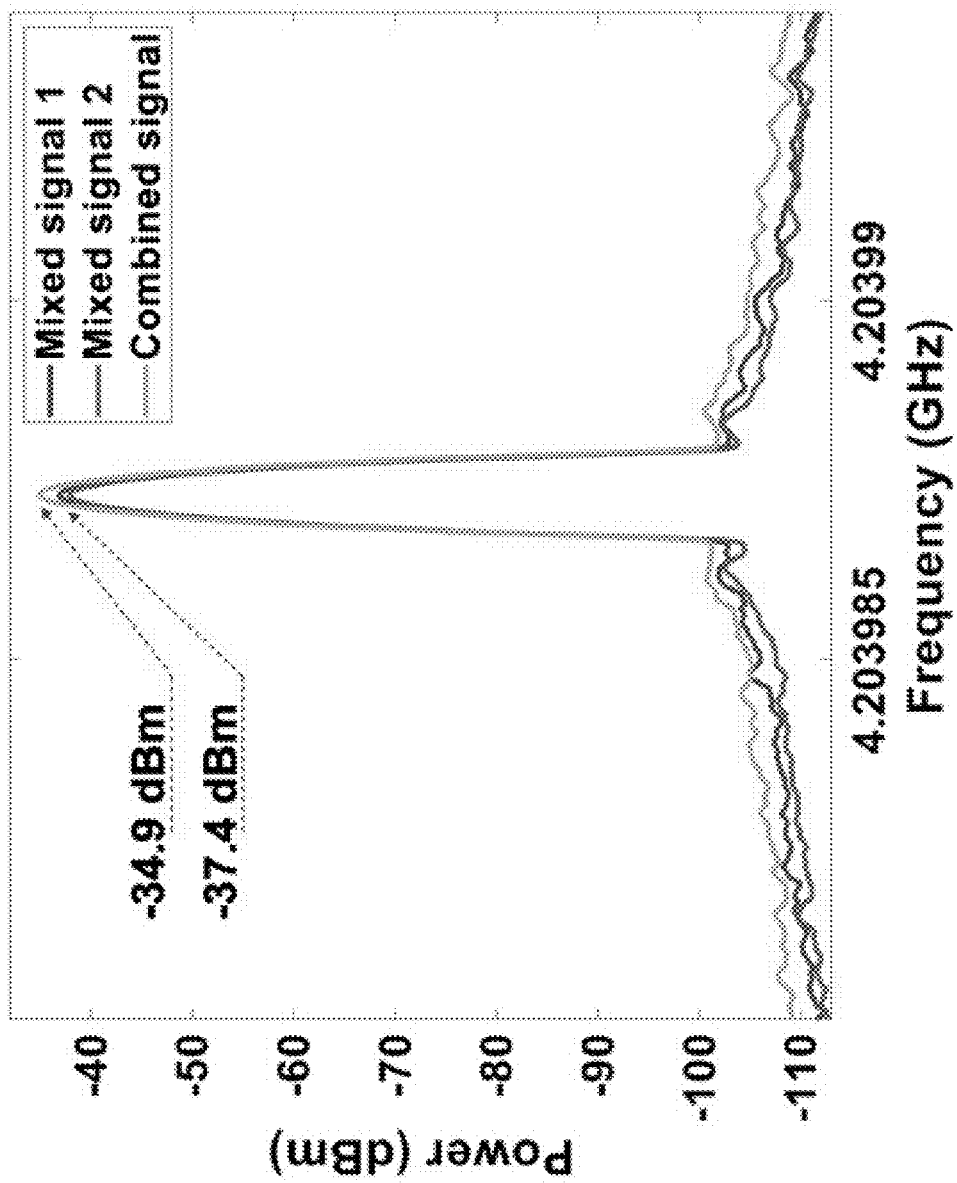
FIG. 7 is a chart showing Power (dBm) vs Frequency (GHz) for an embodiment of the subject invention.

FIG. 7 is a chart showing Power (dBm) vs Frequency (GHz) for an embodiment of the subject invention. Three data series are shown with Mixed signal 1 marked with a solid blue line, Mixed signal 2 a solid red line, and Combined signal a solid yellow line. Arrows indicate the peak of Combined signal at −34.9 dBm and the peak of Mixed signal 1 and Mixed signal 2 at −37.4 dBm. All three peaks occur together at about 4.2 GHz, with two scale points marking the x-axis below the peaks at 4.203985 GHz and above the peaks at 4.20399 GHz.

Embodiments of the subject invention offer numerous advantages. By eliminating phase shifters, the system becomes agnostic to frequency of operation and angle of arrival. This frequency-independent aspect enables multi-function operation and wideband application, reducing significantly the number of components needed; thereby reducing power, cost, and size of the system. The system may be capable of processing a signal received at any direction of arrival, significantly enhancing the angle resolution, making the design more flexible, and no more dependent of frequency of operation: removing phase shifters and bias control circuitry needed to accommodate for every direction of arrival, and reducing power consumption. Certain embodiments may be manufactured through well-known techniques and compatible with off-the-shelf components, as well as being integrated into subarray formations (hybrid beamforming), hence reducing the number of analog-to-digital converters serving the elements. Certain embodiments provide the further advantage of removing PLLs which can be a limiting factor to system stability, size, cost, and power consumption.

As used herein, the terms "about" and "approximately" shall generally mean an acceptable degree of error for the quantity measured given the nature or precision of the measurements. Exemplary degrees of error are within 20 percent (%), typically, within 10%, and more typically, within 5% of a given value or range of values.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to embodiments of the invention.

Example 1—Simulation Results

In accordance with an embodiment of the subject invention, a linear two-element array and additive white Gaussian noise (AWGN) channel was modelled for simulation, as shown in FIG. 2. The RF frequency was set to be 2.31 GHz and, using Equation (7), the LO frequency set as 1.89 GHz. At the receiver side, the model assumed an angle of arrival θ of 20°. The two mixing products yield a combined signal at $f_{RF+LO}$=4.2 GHz with a 3 dB gain in signal power, as depicted in FIG. 3.

Example 2—Experimental Results

In accordance with an embodiment of the subject invention, a two-channel module was built and tested for proof-of-concept using two different setups.

For the first setup, the cross-mixing module was connected directly to a two-port source generator, as depicted in FIG. 4. Commercial off-the-shelf components were used. Consistent with the simulation in Example 1, the RF and LO frequencies were established as 2.31 GHz and 1.89 GHz, respectively. For an angle of arrival AoA of 20°, the resulting waveforms of the mixed signals are shown in FIG. 5, demonstrating coherence in signal phases after cross-mixing.

For the second setup, the signals were transmitted via a horn antenna, as depicted in FIG. 6. A planar two-element triangular monopole antenna array operating from 1.89 GHz to 2.6 GHz was fabricated. The array was designed and built on a Rogers DiClad 880 substrate (Rogers Corporation, Chandler, Ariz.), having a dielectric constant of 2.2, a dielectric loss tangent tan δ=0.04, and a thickness of 1.52 mm. The resulting spectrum of the mixed and combined signals for an angle of arrival of 20° is shown in FIG. 8, demonstrating that cross-mixing in accordance with an embodiment of the subject invention achieves a 3 dB gain, implying coherent signal combining.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A cross-mixing beamformer (CMB) device, comprising:
    an antenna array comprising an array center, a first antenna disposed at a first location with respect to the array center, and a second antenna disposed at a second location opposite from the first location with respect to the array center;
    a first mixing unit in operable communication with the first antenna and the second antenna, the first mixing unit comprising:
        a first input channel configured to receive a first input signal ($y_1$) from the first antenna;
        a first power splitter configured to divide the first input signal into at least two branches, including a first radio frequency (RF) branch connected to a first RF-bandpass filter configured to isolate a first RF signal ($RF_1$), and a first local oscillator (LO) branch connected to a first LO-bandpass filter configured to isolate a first LO signal ($LO_1$);
        a second input channel configured to receive a second input signal ($y_2$) from the second antenna;
        a second power splitter configured to divide the second input signal into at least two branches, including a second RF branch connected to a second RF-bandpass filter configured to isolate a second RF signal ($RF_2$), and a second LO branch connected to a second LO-bandpass filter configured to isolate a second LO signal ($LO_2$);
        a first frequency mixer comprising a first RF-input port configured to receive $RF_1$, a first LO-input port configured to receive $LO_2$, and a first combined-output port configured to produce a first product signal ($y_{P1}$);
        a second frequency mixer comprising a second RF-input port configured to receive $RF_2$, a second LO-input port configured to receive $LO_1$, and a second combined-output port configured to produce a second product signal ($y_{P2}$);
        a first product-bandpass filter configured to isolate $y_{P1}$;
        a second product-bandpass filter configured to isolate $y_{P2}$; and
        a first power combiner configured to combine the isolated $y_{P1}$ with the isolated $y_{P2}$ to produce a first combined signal ($y_{C1}$).

2. The CMB device according to claim 1, the antenna array being a uniform N-antenna element linear array, where N is an even integer number.

3. The CMB device according to claim 1, further comprising:
    a third antenna disposed at a third location with respect to the array center, and a fourth antenna disposed at a fourth location opposite from the third location with respect to the array center;
    a second mixing unit in operable communication with the third antenna and the fourth antenna, the second mixing unit comprising a second power combiner configured to produce a second combined signal ($y_{C2}$); and
    a final summing power combiner configured to combine at least $y_{C1}$ with $y_{C2}$ to produce a final combined output signal ($y_{CF}$).

4. The CMB device according to claim 3, the second mixing unit further comprising:
    a third input channel configured to receive a third input signal from the third antenna;
    a third power splitter configured to divide the third input signal into at least two branches, including a third RF branch connected to a third RF-bandpass filter configured to isolate a third RF signal ($RF_3$), and a third local oscillator (LO) branch connected to a third LO-bandpass filter configured to isolate a third LO signal ($LO_3$);
    a fourth input channel configured to receive a fourth input signal from the fourth antenna;
    a fourth power splitter configured to divide the fourth input signal into at least two branches, including a fourth RF branch connected to a fourth RF-bandpass filter configured to isolate a fourth RF signal ($RF_4$), and a fourth LO branch connected to a fourth LO-bandpass filter configured to isolate a fourth LO signal ($LO_4$);

a third frequency mixer comprising a third RF-input port configured to receive $RF_3$, a third LO-input port configured to receive $LO_4$, and a third combined-output port configured to produce a third product signal ($y_{P3}$);

a fourth frequency mixer comprising a fourth RF-input port configured to receive $RF_4$, a fourth LO-input port configured to receive $LO_3$, and a fourth combined-output port configured to produce a fourth product signal ($y_{P4}$);

a third product-bandpass filter configured to isolate $y_{P3}$; and a fourth product-bandpass filter configured to isolate $y_{P4}$;

the second power combiner configured to combine the isolated $y_{P3}$ with the isolated $y_{P4}$ to produce the second combined signal ($y_{C2}$).

5. The CMB device according to claim 4,
the first mixing unit further comprising:
 a first input low noise amplifier configured to amplify $y_1$ between the first antenna and the first power splitter; and
 a second input low noise amplifier configured to amplify $y_2$ between the second antenna and the second power splitter, and
the second mixing unit further comprising:
 a third input low noise amplifier configured to amplify $y_3$ between the third antenna and the third power splitter; and
 a fourth input low noise amplifier configured to amplify $y_4$ between the fourth antenna and the fourth power splitter.

6. The CMB device according to claim 5, at least one of the first input low noise amplifier, the second input low noise amplifier, the third input low noise amplifier, and the fourth input low noise amplifier having a gain value in a range of from 10 dB to 40 dB.

7. The CMB device according to claim 5, each of the first input low noise amplifier, the second input low noise amplifier, the third input low noise amplifier, and the fourth input low noise amplifier having a gain value in a range of from 10 dB to 40 dB.

8. The CMB device according to claim 4,
the first mixing unit further comprising:
 a first LO low noise amplifier configured to amplify $LO_1$ between the first LO-bandpass filter and the second frequency mixer; and
 a second LO low noise amplifier configured to amplify $LO_2$ between the second LO-bandpass filter and the first frequency mixer, and
the second mixing unit further comprising:
 a third LO low noise amplifier configured to amplify $LO_3$ between the third LO-bandpass filter and the fourth frequency mixer; and
 a fourth LO low noise amplifier configured to amplify $LO_4$ between the fourth LO-bandpass filter and the third frequency mixer.

9. The CMB device according to claim 8, each of the first LO-bandpass filter, the second LO-bandpass filter, the third LO-bandpass filter, and the fourth LO-bandpass filter having a common upper LO-cutoff frequency, a common lower LO-cutoff frequency, and a common desired-LO frequency ($f_{LO}$) therebetween,
each of the first RF-bandpass filter, the second RF-bandpass filter, the third RF-bandpass filter, and the fourth RF-bandpass filter having a common upper RF-cutoff frequency, a common lower RF-cutoff frequency, and a common desired RF frequency ($f_{RF}$) therebetween,
$f_{LO}$ being bounded by an equation of the form, $$f_{RF} - \frac{5c}{36(N-1)d} \leq f_{LO} \leq f_{RF} + \frac{5c}{36(N-1)d}$$

for even-integer values of N corresponding to a uniform N-antenna element linear array where N is an even integer number, c is the speed of light, and d is a distance between adjacent antennas of the antenna array, with $d \leq \lambda_{RF}/2$ and $\lambda_{RF}$ is a wavelength of the common desired RF frequency.

10. The CMB device according to claim 8, the antenna array being a uniform N-antenna element linear array, where N is an even integer number,
N being a number greater than or equal to 2.

11. A cross-mixing beamformer (CMB) method for providing improved beamformed reception signal from an antenna array having an array center and antenna elements $A_{(1)}$ through $A_{(N)}$, where N is an even integer number, the method comprising the steps of:
 selecting one or more unique integer values j, such that $(1 \leq j \leq N/2)$;
 for each selected value of j:
  selecting an antenna element pair ($A_{(j)}$ and $A_{(N-j)}$) where each antenna element of the antenna element pair is located opposite from the other with respect to the array center;
  receiving a first signal $y_{(j)}$ from $A_{(j)}$;
  splitting $y_{(j)}$ and filtering $y_{(j)}$ to produce a first radio frequency signal $RF_{(j)}$ and a first local oscillator signal $LO_{(j)}$;
  receiving a second signal $y_{(N-j)}$ from $A_{(N-j)}$;
  splitting $y_{(N-j)}$ and filtering $y_{(N-j)}$ to produce a second radio frequency signal $RF_{(N-j)}$ and a second local oscillator signal $LO_{(N-j)}$;
  amplifying $LO_{(j)}$;
  amplifying $LO_{(N-j)}$;
  mixing $RF_{(j)}$ and $LO_{(N-j)}$ to produce a first product signal $yp_{(j)}$;
  mixing $RF_{(N-j)}$ and $LO_{(j)}$ to produce a second product signal $yp_{(N-j)}$;
  filtering to isolate $yp_{(j)}$;
  filtering to isolate $yp_{(N-j)}$;
  combining $yp_{(j)}$ and $yp_{(N-j)}$ to produce a combined signal $yc_{(j)}$; and
 summing the combined signal $yc_{(j)}$ for each selected value of j to produce an improved beamformed reception signal, $y_{BF}$.

12. The CMB method according to claim 11, the antenna array being a uniform N-antenna element array.

13. The CMB method according to claim 12, the uniform N-antenna element array being a linear antenna array.

14. The CMB method according to claim 13, the step of selecting one or more unique integer values j, such that $(1 \leq j \leq N/2)$, further comprising selecting all available unique integer values j, such that $(1 \leq j \leq N/2)$.

15. The CMB method according to claim 14, the step of splitting $y_{(j)}$ and filtering $y_{(j)}$ to produce $RF_{(j)}$ and $LO_{(j)}$ further comprising filtering to an RF frequency between $RF_{min}$ and $RF_{max}$ and filtering to an LO frequency between $LO_{min}$ and $LO_{max}$.

16. The CMB method according to claim 14, the step of amplifying $LO_{(j)}$ further comprising amplifying $LO_{(j)}$ with a low noise amplifier, and the step of amplifying $LO_{(N-j)}$ further comprising amplifying $LO_{(N-j)}$ with the low noise amplifier.

17. The CMB method according to claim 14, the step of filtering to isolate $yp_{(j)}$ further comprising filtering to a first output frequency between output/$IF_{min}$ and output/$IF_{max}$, and
the step of filtering to isolate $yp_{(N-j)}$ further comprising filtering to a second output frequency between output/$IF_{max}$ and output/$IF_{max}$, where a desired IF frequency ($f_{IF}$) therebetween is a summation of an RF frequency and an LO frequency.

18. The CMB method according to claim 13, the step of receiving a first signal $y_{(j)}$ from $A_{(j)}$ further comprising amplifying $y_{(j)}$ with a low noise amplifier.

19. A cross-mixing beamformer (CMB) device, comprising:
an antenna array having an array center, a first antenna disposed at a first location with respect to the array center, a second antenna disposed at a second location opposite from the first location with respect to the array center, a third antenna disposed at a third location with respect to the array center, and a fourth antenna disposed at a fourth location opposite from the third location with respect to the array center, the antenna array being a uniform N-antenna element linear array, where N is an even integer number;
a first mixing unit in operable communication with the first antenna and the second antenna, the first mixing unit comprising:
a first input channel configured to receive a first input signal ($y_1$) from the first antenna;
a first power splitter configured to divide the first input signal into at least two branches, including a first radio frequency (RF) branch connected to a first RF-bandpass filter configured to isolate a first RF signal ($RF_1$), and a first local oscillator (LO) branch connected to a first LO-bandpass filter configured to isolate a first LO signal ($LO_1$);
a second input channel configured to receive a second input signal ($y_2$) from the second antenna;
a second power splitter configured to divide the second input signal into at least two branches, including frequency second RF branch connected to a second RF-bandpass filter configured to isolate a second RF signal ($RF_2$), and a second LO branch connected to a second LO-bandpass filter configured to isolate a second LO signal ($LO_2$);
a first frequency mixer comprising a first RF-input port configured to receive $RF_1$, a first LO-input port configured to receive $LO_2$, and a first combined-output port configured to produce a first product signal ($y_{P1}$);
a second frequency mixer comprising a second RF-input port configured to receive $RF_2$, a second LO-input port configured to receive $LO_1$, and a second combined-output port configured to produce a second product signal ($y_{P2}$);
a first product-bandpass filter configured to isolate $y_{P1}$;
a second product-bandpass filter configured to isolate $y_{P2}$; and
a first power combiner configured to combine the isolated $y_{P1}$ with the isolated $y_{P2}$ to produce a first combined signal ($y_{C1}$);
a second mixing unit in operable communication with the third antenna and the fourth antenna, the second mixing unit comprising a second power combiner configured to produce a second combined signal ($y_{C2}$);
the CMB device further comprising a final summing power combiner configured to combine at least $y_{C1}$ with $y_{C2}$ to produce a final combined output signal ($y_{CF}$);
the second mixing unit further comprising:
a third input channel configured to receive a third input signal from the third antenna;
a third power splitter configured to divide the third input signal into at least two branches, including a third RF branch connected to a third RF-bandpass filter configured to isolate a third RF signal ($RF_3$), and a third local oscillator (LO) branch connected to a third LO-bandpass filter configured to isolate a third LO signal ($LO_3$);
a fourth input channel configured to receive a fourth input signal from the fourth antenna;
a fourth power splitter configured to divide the fourth input signal into at least two branches, including a fourth RF branch connected to a fourth RF-bandpass filter configured to isolate a fourth RF signal ($RF_4$), and a fourth local oscillator (LO) branch connected to a fourth LO-bandpass filter configured to isolate a fourth LO signal ($LO_4$);
a third frequency mixer comprising a third RF-input port configured to receive $RF_3$, a third LO-input port configured to receive $LO_4$, and a third combined-output port configured to produce a third product signal ($y_{P3}$);
a fourth frequency mixer comprising a fourth RF-input port configured to receive $RF_4$, a fourth LO-input port configured to receive $LO_3$, and a fourth combined-output port configured to produce a fourth product signal ($y_{P4}$);
a third product-bandpass filter configured to isolate $y_{P3}$; and
a fourth product-bandpass filter configured to isolate $y_{P4}$,
the second power combiner configured to combine the isolated $y_{P3}$ with the isolated $y_{P4}$ to produce the second combined signal ($y_{C2}$);
the first mixing unit further comprising:
a first input low noise amplifier configured to amplify $y_1$ between the first antenna and the first power splitter;
a second input low noise amplifier configured to amplify $y_2$ between the second antenna and the second power splitter;
a first LO low noise amplifier configured to amplify $LO_1$ between the first LO-bandpass filter and the second frequency mixer; and
a second LO low noise amplifier configured to amplify $LO_2$ between the second LO-bandpass filter and the first frequency mixer,
the second mixing unit further comprising:
a third input low noise amplifier configured to amplify $y_3$ between the third antenna and the third power splitter; and
a fourth input low noise amplifier configured to amplify $y_4$ between the fourth antenna and the fourth power splitter;
a third LO low noise amplifier configured to amplify $LO_3$ between the third LO-bandpass filter and the fourth frequency mixer; and
a fourth LO low noise amplifier configured to amplify $LO_4$ between the fourth LO-bandpass filter and the third frequency mixer.

20. The CMB device according to claim 19, each of the first input low noise amplifier, the second input low noise amplifier, the third input low noise amplifier, and the fourth input low noise amplifier having a gain value in a range of from 10 dB to 40 dB,
- each of the first LO-bandpass filter, the second LO-bandpass filter, the third LO-bandpass filter, and the fourth LO-bandpass filter having a common upper LO-cutoff frequency, a common lower LO-cutoff frequency, and a common desired-LO frequency ($f_{LO}$) therebetween,
- each of the first RF-bandpass filter, the second RF-bandpass filter, the third RF-bandpass filter, and the fourth RF-bandpass filter having a common upper RF-cutoff frequency, a common lower RF-cutoff frequency, and a common desired-RF frequency ($f_{RF}$) therebetween, and $f_{LO}$ being bounded by an equation of the form, $$f_{RF} - \frac{5c}{36(N-1)d} \leq f_{LO} \leq f_{RF} + \frac{5c}{36(N-1)d}$$

for even-integer values of N corresponding to the N-antenna element linear array, N being a number greater than or equal to 2, c is the speed of light, and d is a distance between adjacent antennas of the antenna array, with $d \leq \lambda_{RF}/2$ and $\lambda_{RF}$ is a wavelength of the common desired RF frequency.

* * * * *